(12) United States Patent
Tsironis

(10) Patent No.: US 11,092,619 B1
(45) Date of Patent: Aug. 17, 2021

(54) ACTIVE HARMONIC LOAD PULL IMPEDANCE TUNER

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 153 days.

(21) Appl. No.: 16/568,336

(22) Filed: Sep. 12, 2019

Related U.S. Application Data

(62) Division of application No. 16/563,338, filed on Sep. 6, 2019.

(51) Int. Cl.
| | |
|---|---|
| G01R 27/08 | (2006.01) |
| G01R 27/28 | (2006.01) |
| G01R 1/073 | (2006.01) |
| G01R 31/28 | (2006.01) |
| G01R 1/067 | (2006.01) |
| G01R 1/20 | (2006.01) |
| G01R 1/30 | (2006.01) |

(52) U.S. Cl.
CPC ......... *G01R 1/073* (2013.01); *G01R 1/06766* (2013.01); *G01R 1/20* (2013.01); *G01R 1/30* (2013.01); *G01R 31/2822* (2013.01)

(58) Field of Classification Search
CPC ........ G01R 27/04; G01R 27/28; G01R 27/32; G01R 31/2614; G01R 31/2621; G01R 31/2622; H03H 7/38; H03H 7/40; H01P 5/04
See application file for complete search history.

(56) References Cited

U.S. PATENT DOCUMENTS

| | | | |
|---|---|---|---|
| 6,297,649 B1* | 10/2001 | Tsironis | H01P 1/212 324/629 |
| 6,509,743 B1 | 1/2003 | Ferrero | |
| 6,674,293 B1 | 1/2004 | Tsironis | |
| 8,497,689 B1 | 7/2013 | Tsironis | |
| 9,857,410 B1* | 1/2018 | Tsironis | G01R 1/0491 |

OTHER PUBLICATIONS

Load Pull, online, Wikipedia [Retrieved on Nov. 18, 2016]. Retrieved from Internet <URL: http://en.wikipedia.org/wiki/Load_pull>.
"Computer Controlled Microwave Tuner, CCMT", Product Note 41, Focus Microwaves Inc., Jan. 1998, pp. 2-4.
"A new load-pull characterization method for microwave power transistors," Takayama, Y., 1976 IEEE-MTT-S International Microwave Symposium, Cherry Hill (NJ, USA), 1976, p. 218-220.
"ALPS-308. Active Load Pull System for PCN Applications", Product Note 33, Focus Microwaves Inc., Apr. 1996.
Circulator [online], Wikipedia [Retrieved Sep. 2, 2016], Retrieved from Internet <URL: http://en.wikipedia.org/wiki/Circulator>.
(Continued)

*Primary Examiner* — Minh N Tang

(57) ABSTRACT

An active split-signal Fo and 2Fo harmonic impedance load pull tuner uses a single signal source, a wideband harmonic amplitude and phase modulator-frequency doubler. The Fo source signal path is divided between input and output of the DUT; the output portion is processed to generate independently controlled synchronous amplitude and phase controlled Fo and 2Fo signals, which are then amplified and re-injected into the output of the DUT after being prematched using a passive harmonic tuner. A harmonic receiver is used to synthesize in situ the required Fo and 2Fo load impedances. Passive 3Fo tuning is also possible independently.

3 Claims, 10 Drawing Sheets

(56) References Cited

OTHER PUBLICATIONS

Power dividers and directional couplers [online], Wikipedia [Retrieved Aug. 28, 2019], Retrieved from Internet <URL:https://en.wikipedia.org/ wiki/Power_dividers_and_directional_couplers>.

Attenuator (electronics) [online], Wikipedia [Retrieved Aug. 28, 2019], Retrieved from Internet <URL:http://en.wikipedia.org/wiki/Attenuator_ %28electronics%29>.

Phase shift module [online], Wikipedia [Retrieved Aug. 28, 2019], Retrieved from Internet <URL: http://en.wikipedia.org/wiki/Phase_shift_module>.

Frequency multiplier [online], Wikipedia [Retrieved Aug. 28, 2019], Retrieved from Internet <URL: https://en.wikipedia.org/wiki/ Frequency _multiplier>.

N5242A PNA-X Microwave Network Analyzer, 26.5GHz [online], Keysight [Retrieved Sep. 2, 2016], Retrieved from Internet <URL: http://www.home.agilent.com/en/pd-867173-pn- N5242A/pna-x-microwave-network-analyzer?&cc=CA&Ic=engPNA-X>.

R&S ZVA Vector Network Analyzers [online], Rohde & Schwarz [Retrieved Aug. 28, 2019], Retrieved from Internet <URL: http://www.rohde-schwarz.com/ en/product/zva- productstartpage_63493-9660.html>.

"MPT, a universal Multi-Purpose Tuner", Product Note 79, Focus Microwaves Inc., Oct. 2004.

Attention with Isolators [online], Focus Microwaves Inc. [Retrieved Aug. 28, 2019], Retrieved from Internet <URL: https://focus-microwaves.com/wp-content/uploads/2019/06/Attention-with-lsolators.pdf>.

What is a Triplexer? [online], Everything RF [Retrieved Sep. 6, 2019], Retrieved from Internet <URL: https://www.everythingrf.com/community/what-is-a-triplexer>.

* cited by examiner

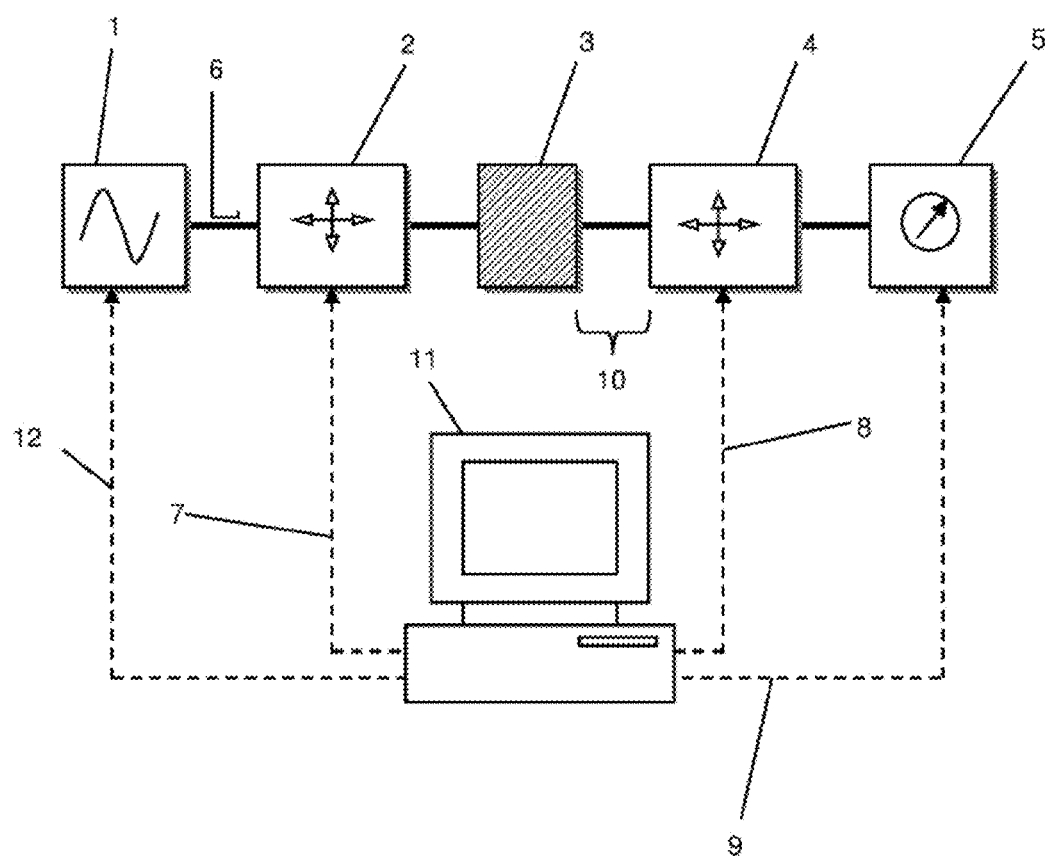
FIG. 1: Prior art

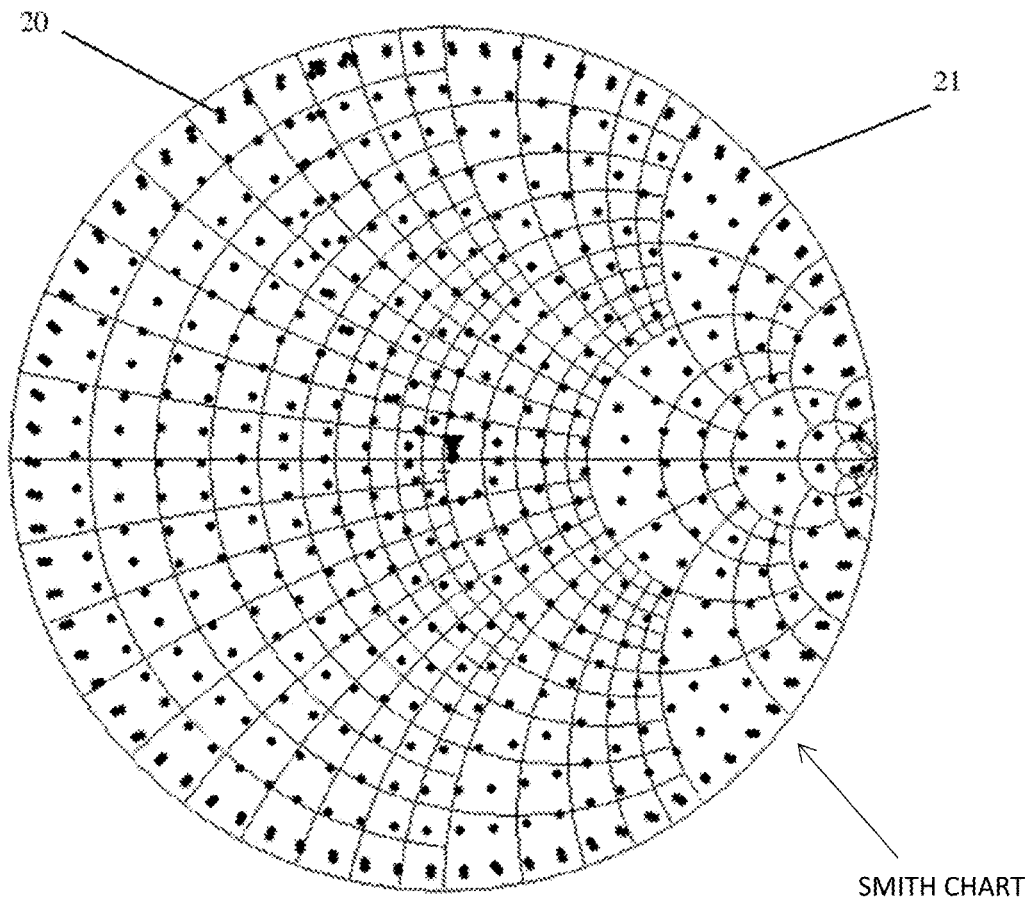
FIG. 2: Prior art

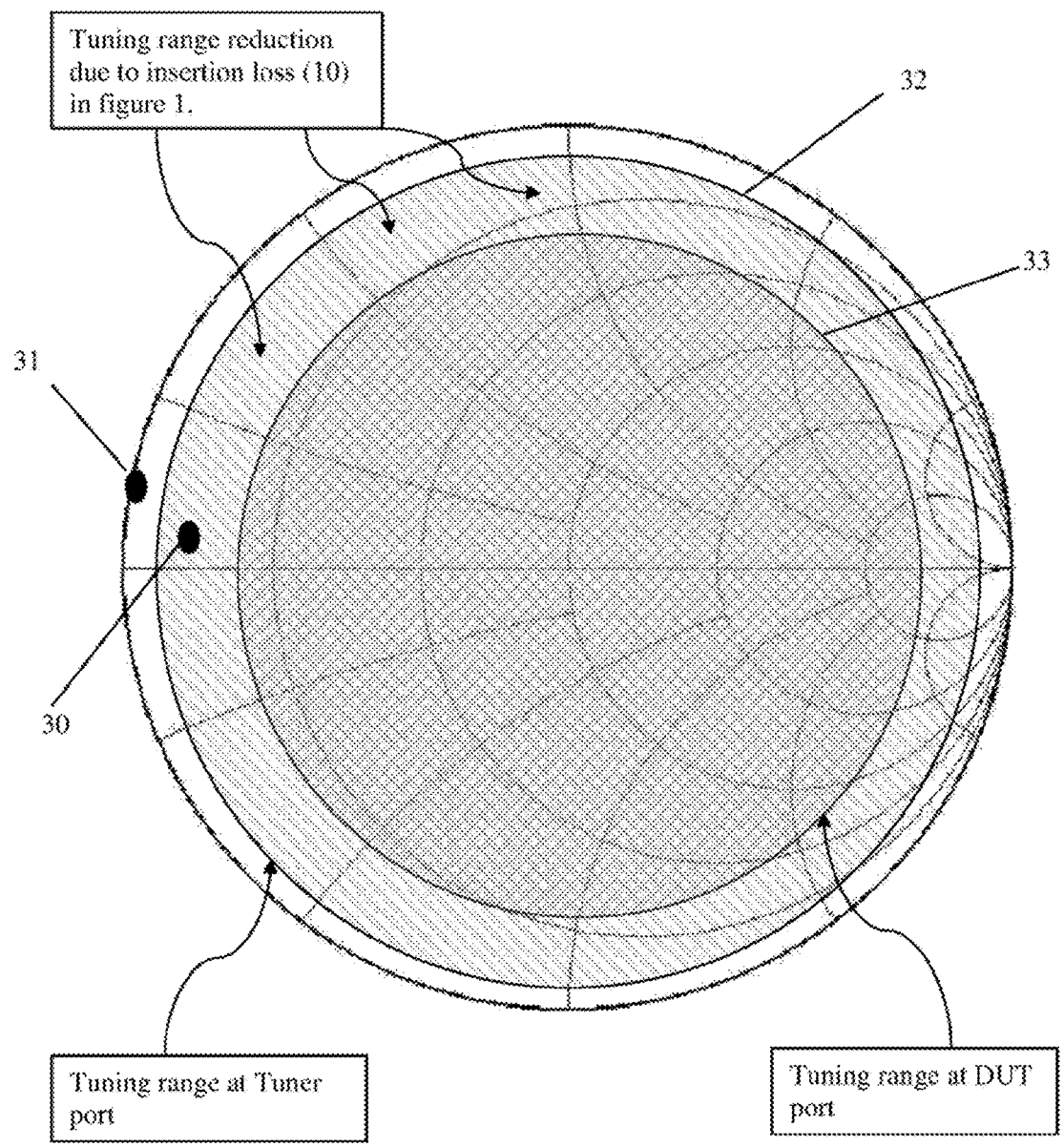
FIG. 3: Prior art

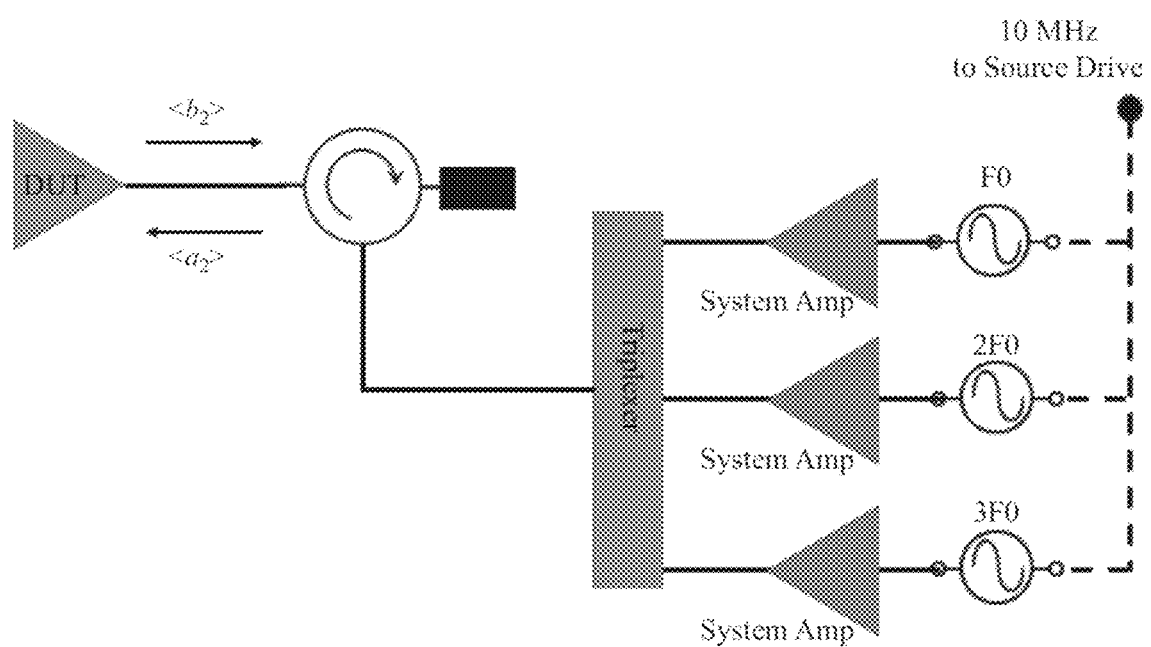
FIG. 5: Prior art

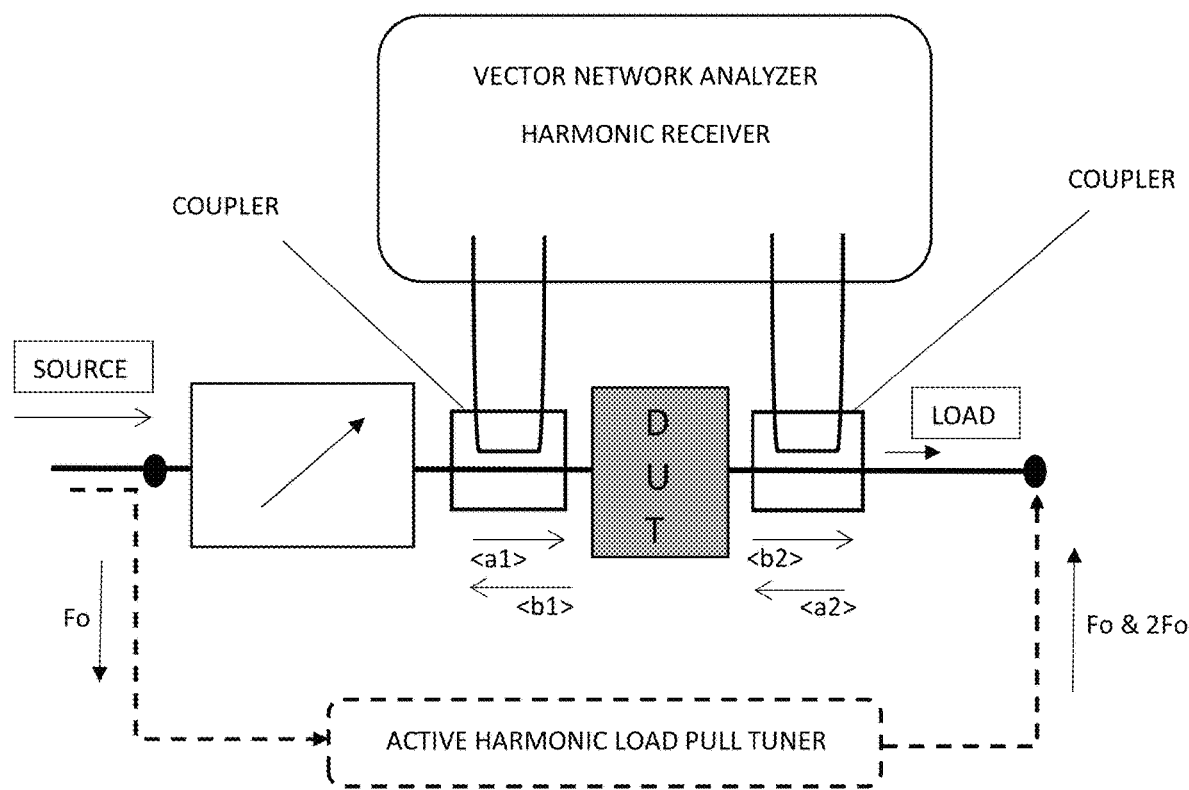
FIG. 10: Prior art

ACTIVE HARMONIC LOAD PULL IMPEDANCE TUNER

PRIORITY CLAIM

This application is a division of U.S. Non-Provisional patent application Ser. No. 16/563,338, filed Sep. 6, 2019, and titled ACTIVE HARMONIC LOAD PULL IMPEDANCE TUNER, which is incorporated herein by reference in its entirety.

CROSS-REFERENCE TO RELATED ARTICLES

1. Load Pull [online] Wikipedia [Retrieved 2016 Nov. 18], Retrieved from Internet <URL: http://en.wikipedia.org/wiki/Load_pull>
2. "Computer Controlled Microwave Tuner—CCMT," Product Note 41, Focus Microwaves Inc., January 1998.
3. "A new load-pull characterization method for microwave power transistors," TAKAYAMA, Y., 1976 IEEE-MTT-S International Microwave Symposium, Cherry Hill (NJ, USA), 1976, p. 218-220.
4. "ALPS-308. Active Load Pull System for PCN Applications", Product Note 33, Focus Microwave Inc., April 1996.
5. TSIRONIS, C., U.S. Pat. No. 8,497,689, "Method for reducing power requirements in active load pull system."
6. Circulator [online], Wikipedia [Retrieved 2016 Sep. 2], Retrieved from Internet <URL: http://en.wikipedia.org/wiki/Circulator>.
7. Power dividers and directional couplers [online], Wikipedia [Retrieved 2019 Aug. 28], Retrieved from Internet <URL: https://en.wikipedia.org/wiki/Power_dividers_and_directional_couplers>.
8. Attenuator (electronics) [online], Wikipedia [Retrieved 2019 Aug. 28], Retrieved from Internet <URL: http://en.wikipedia.org/wiki/Attenuator_%28electronics%29>.
9. Phase shift module [online], Wikipedia [Retrieved 2019 Aug. 28], Retrieved from Internet <URL: http://en.wikipedia.org/wiki/Phase_shift_module>.
10. Frequency multiplier [online], Wikipedia [Retrieved 2019 Aug. 28], Retrieved from Internet <URL: https://en.wikipedia.org/wiki/Frequency_multiplier>.
11. FERRERO, A., U.S. Pat. No. 6,509,743, "Active load or source impedance synthesis apparatus for measurement test set of microwave components and systems."
12. N5242A PNA-X Microwave Network Analyzer, 26.5 GHz [online], Keysight [Retrieved 2016 Sep. 2], Retrieved from Internet <URL: http://www.home.agilent.com/en/pd-867173-pn-N5242A/pna-x-microwave-network-analyzer?&cc=CA&lc=engPNA-X>.
13. R&S ZVA Vector Network Analyzers [online], Rohde & Schwarz [Retrieved 2019 Aug. 28], Retrieved from Internet <URL: http://www.rohde-schwarz.com/en/product/zva-productstartpage_63493-9660.html>.
14. "MPT, a universal Multi-Purpose Tuner", Product Note 79, Focus Microwaves Inc., October 2004.
15. TSIRONIS, C., U.S. Pat. No. 6,674,293, "Adaptable pre-matched tuner system and method".
16. Attention with Isolators [online], Focus Microwaves Inc. [Retrieved 2019 Aug. 28], Retrieved from Internet <URL: https://focus-microwaves.com/wp-content/uploads/2019/06/Attention-with-Isolators.pdf>.
17. What is a Triplexer? [online], Everything RF [Retrieved 2019 Sep. 6], Retrieved from Internet <URL: https://www.everythingrf.com/community/what-is-a-triplexer>.

BACKGROUND OF THE INVENTION

This invention relates to testing and characterization ("Load Pull") of microwave high power transistors and amplifiers (device under test, DUT) using impedance tuners; impedance tuners are passive or active or the combination thereof called hybrid. Passive tuners are electro-mechanical in general of "slide screw" type including a slotted transmission airline and one or more horizontally and vertically movable tuning probes, insertable into the airline slot and capacitively coupled to the center conductor. The tuners have two ports, input and output. One port is used as the test port and the other is idle. When used, the tuners generate amplitude and phase-controlled reflection factor at the test port; the reflection factor as a function of the tuning probe position is measured using a pre-calibrated vector network analyzer (VNA) and normally saved in a calibration file and recalled during operation. Passive harmonic tuners use multiple tuning probes and are able to control independently the reflection factor at the fundamental (Fo) and one or more harmonic frequencies (2Fo, 3Fo etc. . . . ). The active/hybrid tuner disclosed in this invention allows for testing a DUT through acquisition and processing of its RF characteristics, typically gain, output power, efficiency, intermodulation etc., under precise load impedance conditions at the fundamental and one or more harmonic frequencies (see ref. 1); reflection factors $\Gamma$ up to and exceeding $|\Gamma|=1$ at Fo and 2Fo using a single fundamental frequency Fo signal source and a single power amplifier for active output power injection is possible.

DESCRIPTION OF PRIOR ART

Traditional passive load pull systems (FIG. 1) comprise a signal source (1), which may include an input driver amplifier (not shown) to increase the signal power, an input impedance tuner (2) a DUT (Device Under Test) in a test fixture (3), an output impedance tuner (4) and a microwave power sensor (5). The injected power is measured at the coupled port of an input coupler (6), and the output power at the power meter (sensor) (5). Additional components, such as bias tees, attenuators (see ref. 8), filters and couplers, as well as instruments such as power supplies and spectrum analyzers are also used but do not change the basic concept. The DUT's characteristics are measured as a function of source and load impedances generated by the tuners (2) and (4) at the operating (fundamental, Fo) frequency and, if the tuners are multi-probe harmonic, a number of harmonic frequencies (2Fo, 3Fo . . . ). The total is controlled by a system computer (11), which uses control links (7), (8) to the tuners (2), (4) and communication links (9), (12) with the instruments for configuring, triggering and data acquisition (see ref. 1).

The multitude of reflection factors (20), FIG. 2, created by the impedance tuners, cover, typically, the largest part of the reflection factor plan (Smith chart) (21); FIG. 2 shows typical tuner calibration points; appropriate tuning and interpolation algorithms (see ref. 2) between the calibration points allow synthesizing ("tuning to . . . ") almost every impedance within the tuning range (shadowed areas (32) and (33) in FIG. 3); the insertion loss between DUT and tuner (segment (10) in FIG. 1) reduces the effective tuning range (33) at the DUT ports compared with the "tuning range at the tuner port" (32); therefore the actual tuning capacity of such a "passive" tuner system is shown in FIG. 3 as "tuning range at DUT port", (33). However, many power transistors (DUT) need to be gain- and power-matched at impedances shown as dots (30) or (31) in FIG. 3. In the first case (30) a minimization of the test fixture and interconnection loss (10) may allow the tuner to reach this point (30). But in many other cases, like in the case of dot (31) this is simply impossible using a passive system. In this case an "active" solution is necessary.

An active solution (or active tuner) is a configuration, where part of, or an external signal coherent (synchronized) to the original input signal is diverted to the output of the DUT and creates a "virtual" load reflection factor $\Gamma=<a>/<b>$ in total or in combination with a passive component thereof; hereby $<a>$ and $<b>$ are the travelling power waves. This is shown in FIGS. 4 and 5; FIG. 4A depicts the traditional split signal active load pull tuner (see ref. 3); this configuration uses a single source, the signal is split before reaching the DUT and part of it is diverted to the output after being amplified and amplitude and phase modified. This configuration allows only fundamental (Fo) load pull without the possibility of harmonic tuning. The main disadvantage of this tuner is that it requires continuous control of amplitude and phase of the feedback loop signal, using remotely controlled attenuators and phase shifters (see ref. 8, 9) otherwise saturation plots (change of input power at constant load) is impossible, since the gain and phase of the DUT and the feedback amplifier normally do not track. FIG. 4B depicts the active load (see ref. 4). In this case saturation plots are easily possible, because the return signal is proportional to the DUT gain (if the feedback amplifier remains linear) but leakage in the coupler (shown as dotted arrow of the feedback path) risks creating spurious oscillations.

Harmonic load pull in either case FIG. 4A and FIG. 4B requires a second or third parallel active path or load, whose signal is to be combined with the main signal, using a triplexer instead of the circulator (circulators are typically limited to one octave or less, see ref. 6, 18) or a synchronized additional external signal source, as shown in FIG. 4C, marked as "Source 2": General harmonic tuning, based on prior art configurations, requires multiple external sources (see ref. 11, 15). FIG. 5 depicts a true open loop harmonic load pull system. It requires one additional external source per harmonic tuning component, and a triplexer, see ref. 19 (though, the circulator in prior art FIG. 5 looks out of place, since it would limit the bandwidth to one fixed octave, without possibility to adjust Fo and is therefore omitted in this invention).

BRIEF DESCRIPTION OF THE DRAWINGS

The invention and its mode of operation will be better understood from the following detailed description when read with the appended drawings in which:

FIG. 1 depicts prior art, a typical automated load pull test setup using passive tuners only.

FIG. 2 depicts prior art, the distribution of calibration points in passive slide screw tuners on the Smith chart.

FIG. 3 depicts prior art, the reduction of tuning range (tuning dynamics) of passive tuners due to insertion loss between the tuner and the DUT.

FIG. 4A depicts a, fundamental frequency only, open loop split signal active tuner; FIG. 4B depicts the closed loop active load tuner and FIG. 4C depicts the open loop active tuner using a synchronized second source.

FIG. 5 depicts prior art, a multi-harmonic active tuner using a number of synchronized external signal sources and a triplexer.

FIG. 10 depicts prior art, the test setup for measuring injected and reflected harmonic power waves into and from a DUT.

BRIEF DESCRIPTION OF THE INVENTION

Figure 4A:
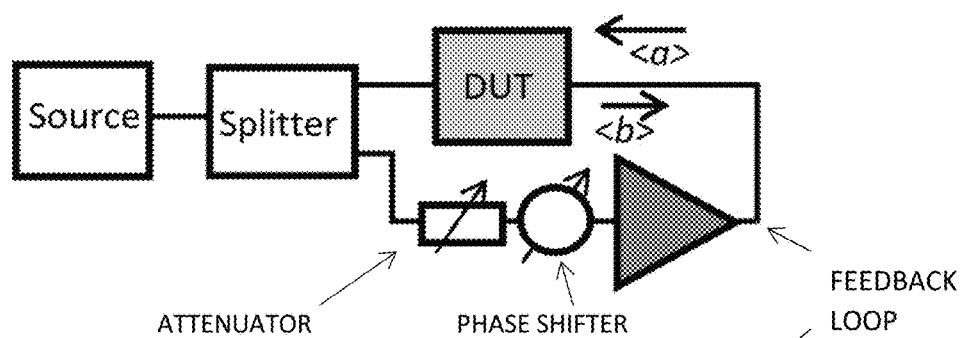
FIGS. 4A through 4c depict prior art, schematic structures of active tuners.
Figure 4B:
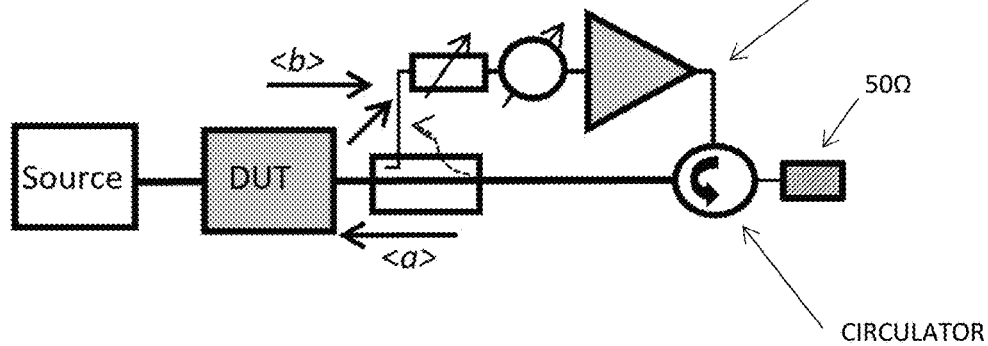
Figure 4C:
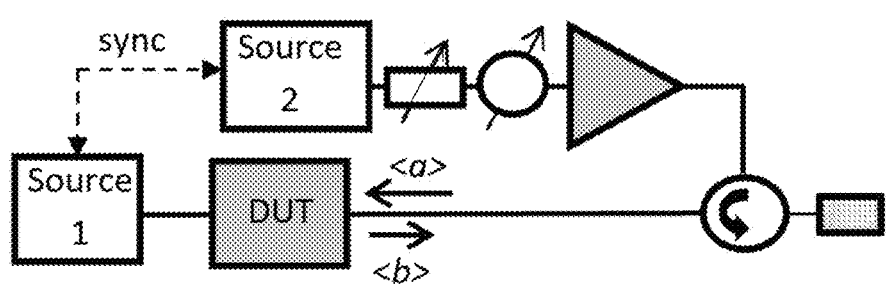

This invention discloses a new two harmonic (Fo and 2Fo) active injection load pull setup, using the split signal principle of FIG. 4A with the distinct benefits of:
(a) Allowing active harmonic loadpull without requiring a second signal source.
(b) Avoiding the "one octave" limitations of the circulator, (see ref. 3, 7), and
(c) a more cost-effective operation.

Figure 6:
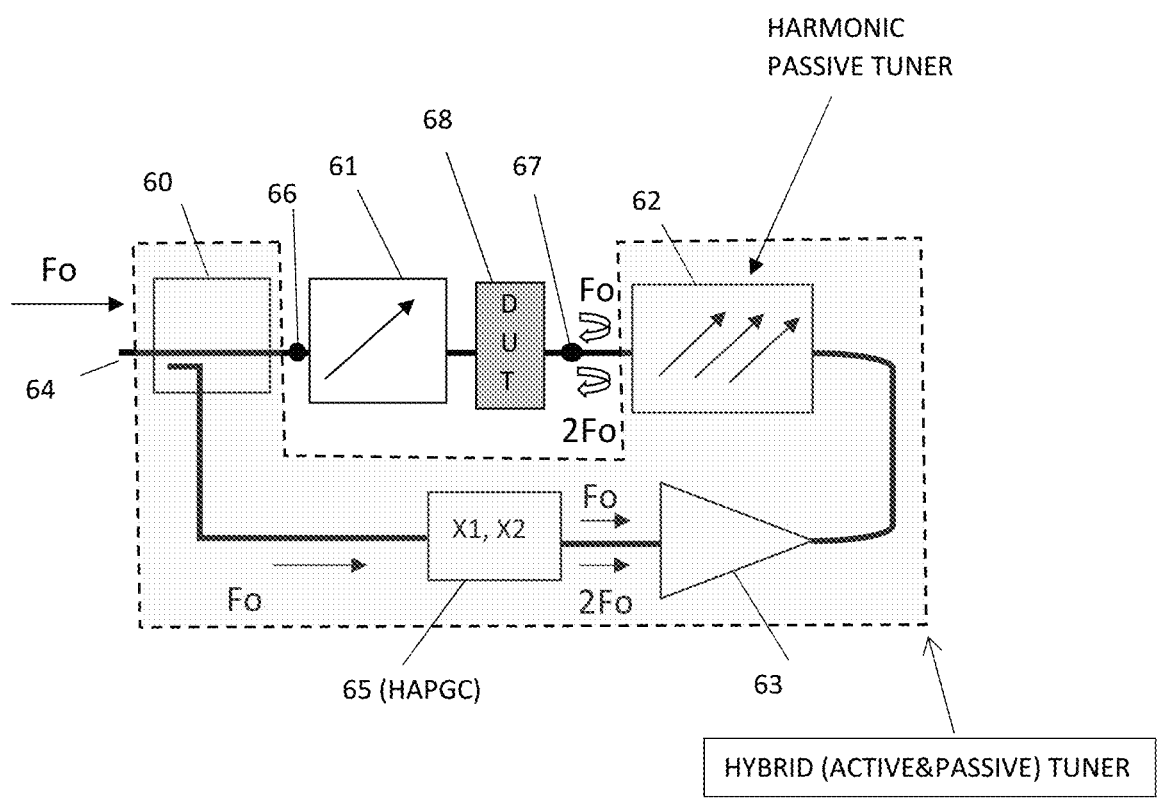
FIG. 6 depicts a load pull test setup comprising the hybrid (active+passive) harmonic tuner using frequency doubler (FD) and harmonic amplitude and phase controller (HAPC), combined in the harmonic amplitude-phase generator-controller (HAPGC), and a pre-matching passive harmonic tuner.
Figure 7:
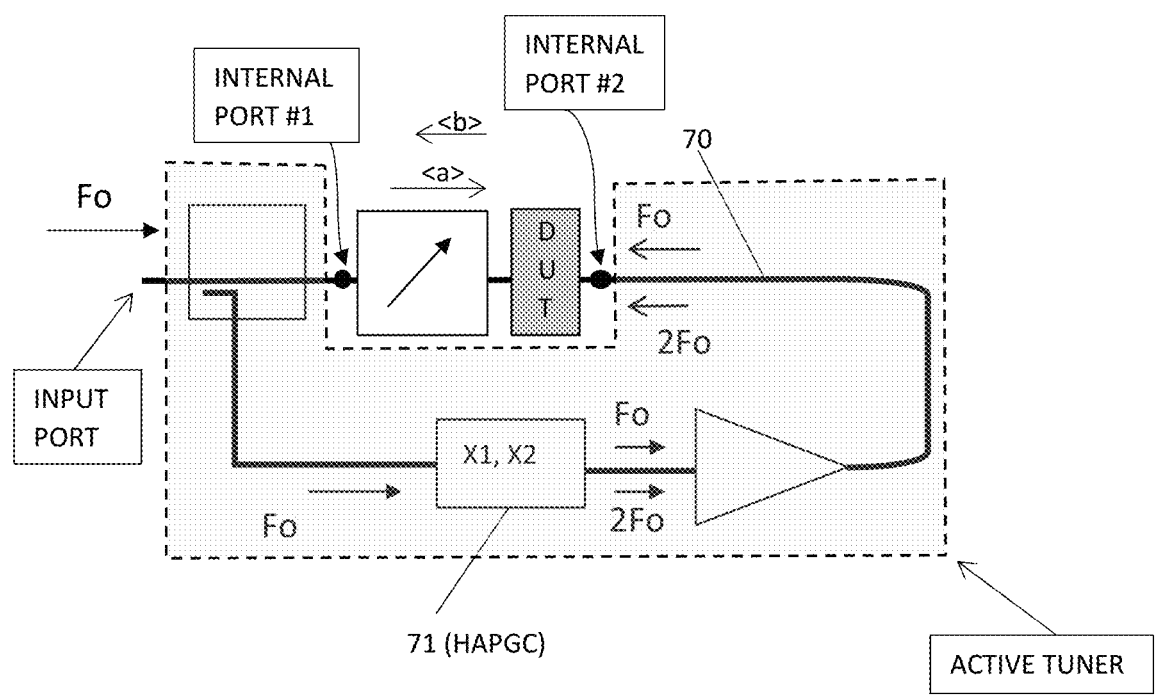
FIG. 7 depicts a load pull test setup comprising the active harmonic tuner using frequency doubler (FD), harmonic amplitude and phase controller (HAPC), combined in the harmonic amplitude-phase generator-controller (HAPGC).

The new tuner requires only a simple frequency doubler, a few passive wideband signal combiners/dividers, one wideband feedback power amplifier and one or two multi-carriage harmonic impedance tuners (see ref. 16 and 17). It also eliminates a hard to find triplexer which has also other side-effects, such as out-of-band high reflection (see ref. 19). All this is made possible by introducing the new concept of a harmonic frequency doubler HFD, a new concept based on a simple frequency doubler FD (see ref. 10), employing only wideband signal combiners, instead of circulators, combined with a harmonic amplitude and phase controller HAPC (FIGS. 6 and 7). In addition to active injection the passive multi-probe harmonic tuner (62) provides also, in the hybrid embodiment, for independent passive third harmonic (3Fo) tuning. In the context of this invention I use a number of device abbreviations: FD means frequency doubler, a device in which signal at Fo is injected and from which signal at 2Fo is extracted; HFD means harmonic frequency doubler, a device in which signal at Fo is injected and from which two signals, one at Fo and one at 2Fo are extracted; HAPC means harmonic amplitude and phase controller, a device that can control independently amplitude and phase of signal transmitted through it, at two frequencies Fo and 2Fo; HAPGC means harmonic amplitude and phase generator-controller, a device, made as a cascade of HFD and HAPC, that accepts signal at Fo and generates, independently amplitude- and phase-controlled, signals at Fo and 2Fo. In short, new in this invention is a harmonic feedback loop that generates itself the harmonic coherent signal and also controls independently amplitude and phase of both harmonic feedback injected signals; this, to date, has only been possible using synchronized and modulated additional external signal generators.

DETAILED DESCRIPTION OF THE INVENTION

The harmonic split signal active injection load pull tuner is shown framed embedded in an actual load pull test setup in FIG. 6. It includes one input port (64) and two internal test ports, port #1 (66) and port #2 (67); in a load pull test setup an input tuner (61) and the DUT inside a test fixture (68) are inserted between internal test ports #1 (66) and #2 (67). The active tuner comprises a directional coupler (60) inserted between the signal source and the internal port #1 (linked to the input impedance tuner (61) of the load pull setup); the coupler (60) is used to extract part of the signal injected into port (64) and feed it into the harmonic amplitude-phase generator-controller (HAPGC) (65). The incoming signal into the HAPGC (65) at the fundamental frequency Fo generates two outgoing signals one at Fo and one at 2Fo, each controllable individually in amplitude and phase. Both signals are then amplified by the wideband power amplifier (63) and re-injected back into the output of the DUT. In a first hybrid embodiment, (FIG. 6) a passive multi-probe harmonic tuner (62) is used to reduce the power requirement to the amplifier (63) at both frequencies Fo and 2Fo, see ref. 5. In an alternative, purely active, embodiment (FIG. 7) the pre-matching tuner (62) can be omitted (70). In this case both fundamental and harmonic tuning is created using only the harmonic doubler-controller (65) and the amplifier (63). Employing a single probe wideband non-harmonic pre-matching tuner instead of the multi-harmonic tuner (62) in order to improve power efficiency is meaningless, since, any power savings at Fo due to pre-matching, are cancelled at 2Fo by the missing pre-matching control at 2Fo; this means that a wideband single probe tuner may reduce the power requirement at Fo but the signal at 2Fo will probably be, in many cases, additionally heavily mismatched, in which case the requirement to power amplifier will not benefit from the savings at Fo. The passive multi-probe harmonic tuner (62), if it includes three tuning probes (see ref. 16) may provide, additionally to power savings, also for independent passive third harmonic (3Fo) tuning.

A signal combiner is a reciprocal (each port can be used as input or output) passive three-port RF device with one common and two secondary ports. The secondary ports are input ports when the device is used as a signal combiner, the combined signals exiting from the common port. When the device is used as a signal divider, then the signal enters at the common port and is equally divided between the secondary (now output) ports.

Figure 8:
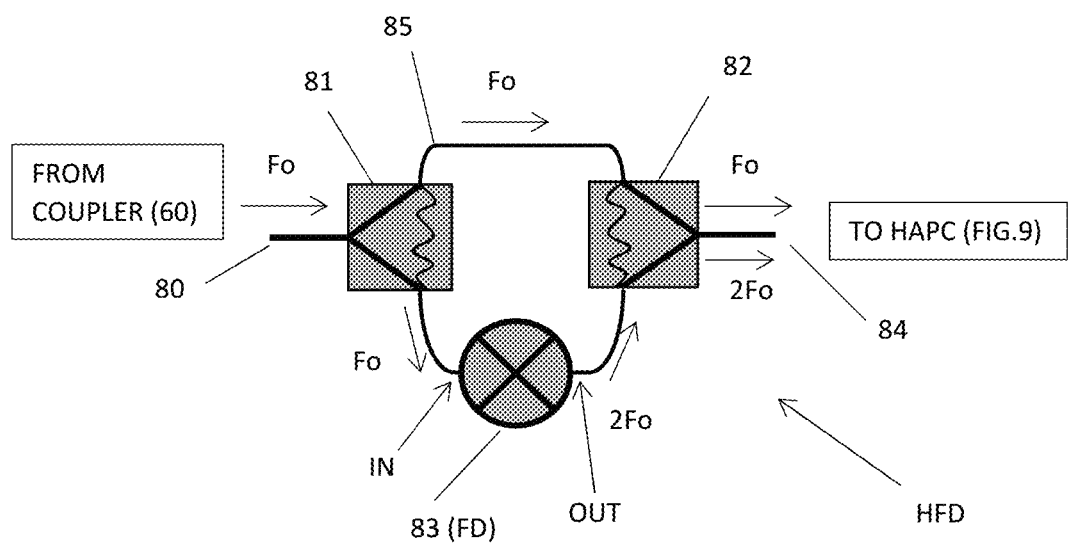
FIG. 8 depicts the harmonic frequency doubler (HFD).
Figure 9:
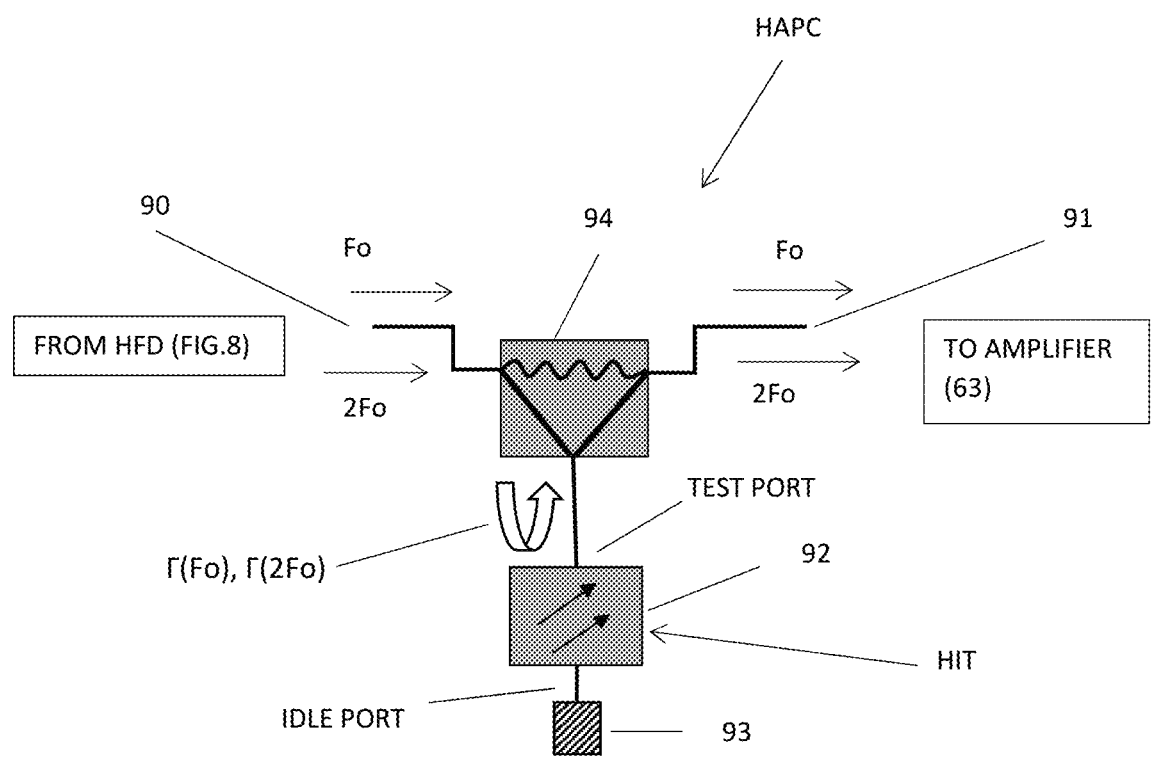
FIG. 9 depicts the wideband harmonic amplitude and phase controller (HAPC).

The new device that enables this split signal active harmonic load pull is the wideband harmonic amplitude-phase generator-controller (HAPGC) (65), (71), of which the two components are shown in FIGS. 8 and 9: The new device, the harmonic amplitude and phase generator-controller (HAPGC) comprises two cascaded stages:
(a) a first stage (FIG. 8), the harmonic frequency doubler (HFD), which splits (81), passes through the fundamental at Fo (85), doubles (83) the injected (80) fundamental Fo signal, recombines (82) both and allows extracting at port (84) a fundamental signal at Fo and a second harmonic component at 2Fo; and
(b) the harmonic amplitude and phase controller (HAPC) (FIG. 9), which uses a wideband signal combiner (94) and a multi-carriage harmonic impedance tuner (92) allowing control of the amplitude and the phase of the signal transmitted from port (90) to port (91) at the two frequencies Fo and 2Fo independently.

In the harmonic amplitude and phase controller (HAPC) of FIG. 9 the combined Fo plus 2Fo signal from the harmonic frequency doubler of FIG. 8 enters into port (90) of the combiner (94) and is directed to the test port of a multi-carriage harmonic impedance tuner (92) see ref. 16, whose other port is terminated with 50 Ohm (93). Such tuners are able to create reflection factor Γ at two or more frequencies independently as shown in FIG. 9 in the form Γ(Fo) and Γ(2Fo). This means, the signals at Fo and 2Fo are controlled in amplitude and phase independently when they pass through the harmonic controller HAPC. This allows not only control of the phase, but also the correction of any remaining imbalance between the two signals coming from the doubler. The capacity of the multi-carriage tuner is practically unlimited. It may change amplitude and phase at Fo and keep 2Fo completely constant and vice versa and this over a large frequency band, such as 0.8-18 GHz or 2-26 GHz or 8-60 GHz. The signals exiting from port (91) are fed into the wideband power amplifier (63) and from there into the output port of the DUT either directly (70) or via a pre-matching harmonic tuner (62), which creates overlapping reflection vectors, this way reducing the power requirement of the power amplifier (63), see ref. 5.

In the actual measurement environment bi-directional couplers (FIG. 10) are inserted before and after the DUT and connected to the direct receiver access ports of a harmonic receiver (Vector network Analyzer, VNA, see ref. 12, 13) to allow for real time measurement of the injected and reflected power waves <a> and <b> at the input and output ports of the DUT (FIG. 7) and be able to tune in real-time to the desired load impedance by adjusting the passive tuner (62) and/or the tuner (92) of the amplitude-phase controller of FIG. 9.

This invention discloses a new split signal active harmonic load pull in two possible embodiments and associated frequency doubler and harmonic amplitude and phase controller. Alternative configurations are imaginable, because of the numerous secondary accessories that may be used, but shall not impede on the originality of the disclosed preferred embodiments.

What I claim as my invention is:

1. A harmonic amplitude and phase generator-controller (HAPGC) for active harmonic load pull tuner, said HAPGC having input and output port and comprising a cascade of a harmonic frequency doubler (HFD) having input and output port, and
   a harmonic amplitude and phase controller (HAPC) having input and output port,
   wherein
      the input port of the HAPGC is linked to the input port of the HFD,
      the output port of the HFD is connected to the input of the HAPC,
      the output port of the HAPC is linked to the output port of the HAPGC.

2. The harmonic frequency doubler (HFD), as in claim 1, comprising
   two signal combiners (SC) #1 and #2, each having one common port and two output ports, and
   a frequency doubler (FD) having input and output port, wherein
      the common port of SC #1 is linked to the input port of the HFD,
      one output port of SC #1 is connected to one output port of SC #2,
      the other output port of SC #1 is connected to the input port of the FD,
      the output port of the FD is connected to the other output port of SC #2,
      the common port of SC #2 is linked to the output port of the HFD.

3. The harmonic amplitude and phase controller (HAPC), as in claim 1, comprising
- a signal combiner (SC) having one common and two output ports, and
- a harmonic multi-probe impedance tuner (HIT) having test and idle port, wherein
- one output port of the SC is linked to the input port of the HAPC,
- the other output port of the SC is linked to the output port of the HAPC,
- the common port of the SC is connected to the test port of the HIT,
- the idle port of the HIT is terminated with characteristic impedance Zo.

\* \* \* \* \*